United States Patent
Siebel et al.

(10) Patent No.: US 10,884,039 B2
(45) Date of Patent: Jan. 5, 2021

(54) SYSTEMS AND METHODS FOR PROCESSING DATA RELATING TO ENERGY USAGE

(71) Applicant: C3.ai, Inc., Redwood City, CA (US)

(72) Inventors: Thomas M. Siebel, Woodside, CA (US); Edward Y. Abbo, Woodside, CA (US); Houman Behzadi, San Francisco, CA (US); John Coker, Atherton, CA (US); Scott Kurinskas, San Mateo, CA (US); Thomas Rothwein, San Jose, CA (US); David Tchankotadze, Sunnyvale, CA (US)

(73) Assignee: C3.ai, Inc., Redwood City, CA (US)

( * ) Notice: Subject to any disclaimer, the term of this patent is extended or adjusted under 35 U.S.C. 154(b) by 523 days.

(21) Appl. No.: 14/699,508

(22) Filed: Apr. 29, 2015

(65) Prior Publication Data

US 2015/0233983 A1    Aug. 20, 2015

Related U.S. Application Data

(63) Continuation of application No. 14/495,827, filed on Sep. 24, 2014, now abandoned.
(Continued)

(51) Int. Cl.
*G01R 21/00* (2006.01)
*G01R 21/133* (2006.01)
(Continued)

(52) U.S. Cl.
CPC ........... *G01R 21/00* (2013.01); *G01R 21/133* (2013.01); *G06F 16/2365* (2019.01);
(Continued)

(58) Field of Classification Search
CPC ..................................................... G01R 21/00
See application file for complete search history.

(56) References Cited

U.S. PATENT DOCUMENTS 5,132,920 A * 7/1992 Bellows ............. G05B 23/0283
702/184
6,178,362 B1 * 1/2001 Woolard ................ G01R 22/00
700/28

(Continued)

FOREIGN PATENT DOCUMENTS

WO   WO-2015066220 A2   5/2015
WO   WO-2016118979 A2   7/2016

OTHER PUBLICATIONS

International Application No. PCT/US2014/062974, International Search Report and Written Opinion dated Feb. 19, 2015.
(Continued)

*Primary Examiner* — Raymond L Nimox
(74) *Attorney, Agent, or Firm* — Wilson Sonsini Goodrich & Rosati

(57) ABSTRACT

Processing of data relating to energy usage. First data relating to energy usage is loaded for analysis by an energy management platform. Second data relating to energy usage is stream processed by the energy management platform. Third data relating to energy usage is batch parallel processed by the energy management platform. Additional computing resources, owned by a third party separate from an entity that owns the computer system that supports the energy management platform, are provisioned based on increasing computing demand. Existing computing resources owned by the third party are released based on decreasing computing demand.

18 Claims, 7 Drawing Sheets

Related U.S. Application Data

(60) Provisional application No. 61/897,159, filed on Oct. 29, 2013.

(51) Int. Cl.
*G06Q 50/06* (2012.01)
*G06Q 10/06* (2012.01)
*G06F 16/2455* (2019.01)
*G06F 16/2453* (2019.01)
*G06F 16/25* (2019.01)
*G06F 16/28* (2019.01)
*G06F 16/23* (2019.01)

(52) U.S. Cl.
CPC .. *G06F 16/24542* (2019.01); *G06F 16/24568* (2019.01); *G06F 16/258* (2019.01); *G06F 16/288* (2019.01); *G06Q 10/06* (2013.01); *G06Q 50/06* (2013.01); *Y02P 90/82* (2015.11)

(56) References Cited

U.S. PATENT DOCUMENTS

| | | | |
|---|---|---|---|
| 7,137,071 B2 | 11/2006 | Fuller et al. | |
| 7,159,208 B2 | 1/2007 | Keeley | |
| 7,200,529 B2 | 4/2007 | Cifra et al. | |
| 7,590,970 B2 | 9/2009 | Bromley | |
| 7,877,421 B2 | 1/2011 | Berger et al. | |
| 8,166,465 B2 | 4/2012 | Feblowitz et al. | |
| 8,180,872 B1 | 5/2012 | Marinelli et al. | |
| 8,442,917 B1 | 5/2013 | Burke | |
| 8,626,877 B2 | 1/2014 | Greene et al. | |
| 8,972,484 B2 | 3/2015 | Naphade et al. | |
| 9,069,737 B1 | 6/2015 | Kimotho et al. | |
| 9,148,669 B2 | 9/2015 | Huang et al. | |
| 9,268,815 B2 | 2/2016 | Chen et al. | |
| 9,281,995 B2 | 3/2016 | Baba et al. | |
| 9,734,221 B2 | 8/2017 | Sarferaz | |
| 9,799,017 B1 | 10/2017 | Vermeulen et al. | |
| 9,824,133 B1 | 11/2017 | Kalki et al. | |
| 9,886,483 B1 | 2/2018 | Harrison et al. | |
| 9,922,101 B1 | 3/2018 | Reiner et al. | |
| 10,114,367 B2 | 10/2018 | Bates et al. | |
| 10,235,780 B2 | 3/2019 | Noon et al. | |
| 2003/0034998 A1 | 2/2003 | Kodosky et al. | |
| 2003/0037322 A1 | 2/2003 | Kodosky et al. | |
| 2003/0041163 A1 | 2/2003 | Rhoades et al. | |
| 2003/0172368 A1 | 9/2003 | Alumbaugh et al. | |
| 2003/0177146 A1 | 9/2003 | Zimowski | |
| 2004/0224549 A1* | 11/2004 | Yu | H05K 7/1007 439/342 |
| 2004/0225649 A1 | 11/2004 | Yeo et al. | |
| 2005/0050054 A1 | 3/2005 | Clark et al. | |
| 2005/0177816 A1 | 8/2005 | Kudukoli et al. | |
| 2005/0228808 A1 | 10/2005 | Mamou et al. | |
| 2005/0234969 A1 | 10/2005 | Mamou et al. | |
| 2005/0240592 A1 | 10/2005 | Mamou et al. | |
| 2006/0010148 A1 | 1/2006 | Sattler et al. | |
| 2006/0259442 A1 | 11/2006 | Iqbal | |
| 2007/0112714 A1 | 5/2007 | Fairweather et al. | |
| 2007/0214408 A1 | 9/2007 | Straub et al. | |
| 2009/0044179 A1 | 2/2009 | Luszczek et al. | |
| 2009/0044196 A1 | 2/2009 | Stefansson et al. | |
| 2009/0132867 A1 | 5/2009 | Stefansson et al. | |
| 2009/0228726 A1* | 9/2009 | Malik | G06F 1/3203 713/320 |
| 2010/0070217 A1 | 3/2010 | Shimada et al. | |
| 2010/0094475 A1 | 4/2010 | Masters et al. | |
| 2010/0223296 A1 | 9/2010 | Angus et al. | |
| 2010/0262313 A1* | 10/2010 | Chambers | G05B 15/02 700/295 |
| 2010/0274367 A1* | 10/2010 | Kaufman | G05B 17/02 700/31 |
| 2010/0274602 A1 | 10/2010 | Kaufman et al. | |
| 2010/0286937 A1* | 11/2010 | Hedley | G06Q 30/02 702/60 |
| 2011/0010016 A1* | 1/2011 | Giroti | G05B 15/02 700/291 |
| 2011/0252426 A1 | 10/2011 | Antani et al. | |
| 2012/0002733 A1 | 1/2012 | Misra et al. | |
| 2012/0022910 A1 | 1/2012 | Chi et al. | |
| 2012/0054147 A1 | 3/2012 | Goetz et al. | |
| 2012/0266129 A1 | 10/2012 | Massoudi et al. | |
| 2012/0271472 A1* | 10/2012 | Brunner | G06F 1/3209 700/295 |
| 2012/0310559 A1 | 12/2012 | Taft | |
| 2013/0124453 A1 | 5/2013 | Bhide et al. | |
| 2013/0173322 A1* | 7/2013 | Gray | G06Q 50/06 705/7.13 |
| 2013/0211870 A1 | 8/2013 | Lawson et al. | |
| 2013/0212420 A1 | 8/2013 | Lawson et al. | |
| 2013/0238795 A1 | 9/2013 | Geffin et al. | |
| 2013/0332194 A1 | 12/2013 | D et al. | |
| 2013/0346422 A1 | 12/2013 | Jordahl | |
| 2014/0046956 A1 | 2/2014 | Zenger et al. | |
| 2014/0047107 A1 | 2/2014 | Maturana et al. | |
| 2014/0058572 A1* | 2/2014 | Stein | G06Q 50/06 700/291 |
| 2014/0074670 A1* | 3/2014 | Garrity | G06Q 10/04 705/30 |
| 2014/0156806 A1 | 6/2014 | Karpistsenko et al. | |
| 2014/0279824 A1 | 9/2014 | Tamayo | |
| 2014/0279837 A1 | 9/2014 | Guo et al. | |
| 2014/0279899 A1 | 9/2014 | Gu et al. | |
| 2014/0280142 A1 | 9/2014 | Wasson et al. | |
| 2014/0337429 A1 | 11/2014 | Asenjo et al. | |
| 2015/0019195 A1 | 1/2015 | Davis | |
| 2015/0095303 A1 | 4/2015 | Sonmez et al. | |
| 2015/0120224 A1 | 4/2015 | Siebel et al. | |
| 2015/0134733 A1 | 5/2015 | Maturana et al. | |
| 2016/0078379 A1 | 3/2016 | Branch et al. | |
| 2017/0006135 A1 | 1/2017 | Siebel et al. | |
| 2017/0126741 A1 | 5/2017 | Lang et al. | |
| 2018/0107660 A1 | 4/2018 | Wang et al. | |
| 2019/0007517 A1 | 1/2019 | Jagannath et al. | |
| 2019/0065545 A1 | 2/2019 | Hazel et al. | |
| 2019/0265971 A1 | 8/2019 | Behzadi et al. | |

OTHER PUBLICATIONS

Co-pending U.S. Appl. No. 15/890,867, filed Feb. 7, 2018.
EP14857450.2 Extended Search Report and Search Opinion dated Apr. 5, 2017.
McKinsey and Company. The Internet of Things, Mapping the Value Beyond the Hype. Jun. 2015.
Office Action dated Jun. 16, 2017 for U.S. Appl. No. 14/495,827.
Office Action dated Dec. 12, 2017 for U.S. Appl. No. 14/495,827.
PCT/US2016/023850 International Search Report and Written Opinion dated Dec. 9, 2016.
Porter, et al. How Smart, Connected Products are Transforming Competition, Harvard Business Review, Nov. 2014.
UC Regents. Cyber-Physical systems. 2012.
Wikipedia—Batch processing. Sep. 30, 2013; available at https://en.wikipedia.org/w/index.php?title=Batch_processing&oldid=575104736.
Wikipedia—Stream processing. Sep. 22, 2013; Avaliable at https://en.wikipedia.org/w/index.php?title=Stream_processing&oldid=574006420.
ZapThink. Understanding the Real Costs of Integration. 2002. Available at http://www.zapthink.com/2002/10/23/understanding-the-real-costs-of-integration. Accessed on Mar. 30, 2018.
Lheureux et al. Predicts 2015: Digital Business and Internet of Things Add Formidable Integration Challenges. Gartner, Nov. 11, 2014.
Middleton, et al. Forecast: Internet of Things, Endpoints and Associated Services, Worldwide, 2014. Gartner, Feb. 16, 2015.
Co-pending U.S. Appl. No. 16/044,199, filed Jul. 24, 2018.
Soley et al. Model Driven Architecture. Object Management Group (OMG), White Paper, Draft 3.2 (Nov. 27, 2000). 12 pages. Retrieved from URL:<https://www.omg.org/mda/mda_files/model_driven_architecture.htm>.

(56) References Cited

OTHER PUBLICATIONS

EP16740923.4 Extended European Search Report dated Jan. 7, 2019.
U.S. Appl. No. 15/890,867 Office Action dated Apr. 1, 2019.
U.S. Appl. No. 15/028,340 Office Action dated Apr. 30, 2019.
U.S. Appl. No. 15/890,867 Office Action dated Sep. 25, 2019.
U.S. Appl. No. 16/360,815 Office Action dated May 30, 2019.
Polamuri. Supervised and Unsupervised Learning (Sep. 19, 2014). Retrieved Oct. 25, 2019 from URL: <https://dataaspirant.com/2014/09/19/supervised-and-unsupervised-learning/>. 9 pages.
U.S. Appl. No. 15/028,340 Office Action dated Jan. 16, 2020.
U.S. Appl. No. 16/360,815 Office Action dated Oct. 30, 2019.
EP14857450.2 Summons to Attend Oral Proceedings dated Jul. 16, 2020.
U.S. Appl. No. 15/028,340 Notice of Allowance dated Aug. 26, 2020.
U.S. Appl. No. 15/890,867 Notice of Allowance dated Aug. 27, 2020.
U.S. Appl. No. 15/890,867 Office Action dated Apr. 9, 2020.
U.S. Appl. No. 15/890,867 Office Action dated Mar. 27, 2020.
U.S. Appl. No. 16/044,199 Office Action dated Jun. 26, 2020.
U.S. Appl. No. 16/360,815 Office Action dated Apr. 16, 2020.

* cited by examiner

SYSTEMS AND METHODS FOR PROCESSING DATA RELATING TO ENERGY USAGE

CROSS-REFERENCE TO RELATED APPLICATIONS

The present application is a Continuation of U.S. patent application Ser. No. 14/495,827, filed Sep. 24, 2014, entitled "SYSTEMS AND METHODS FOR PROCESSING DATA RELATING TO ENERGY USAGE", which claims priority from U.S. Provisional Patent Application No. 61/897,159, filed Oct. 29, 2013, entitled "SYSTEMS AND METHODS FOR PROCESSING DATA RELATING TO ENERGY USAGE," which are incorporated in their entireties herein by reference.

FIELD OF THE INVENTION

The present invention relates to the field of energy management and, more particularly, processing of data relating to energy usage.

BACKGROUND

Conventional energy management tools are intended to help companies track energy usage. For example, such tools may collect certain types of energy-related information, including billing statements and energy meter readings. The collected information may be used to understand energy usage. Such tools may also generate reports that detail energy-related information and usage. The reports may be used to identify a possible need for energy savings initiatives.

Conventional energy management tools are often provided through custom implementations of multiple products provided by different vendors. Custom implementations can require considerable upfront expense and delay associated with purchase and maintenance of various hardware and software packages. Further, custom implementations can necessitate significant expense and complication in the integration of disparate software packages as well as challenges in connecting to required data sources. Custom implementations likewise can be difficult to maintain and upgrade. In addition, the functionality of a custom implementation is often limited given the narrow scope of its intended purpose.

SUMMARY

To allow analysis of data relating to energy usage, embodiments of the invention include systems, methods, and computer readable media to provide an energy management platform. First data relating to energy usage is loaded for analysis by the energy management platform. Second data relating to energy usage is stream processed. Third data relating to energy usage is batch parallel processed.

In an embodiment, the loading includes converting the first data relating to energy usage from a canonical form according to a data model of the energy management platform.

In an embodiment, the loading includes performing validation on the first data relating to energy usage.

In an embodiment, the performing validation on the first data relating to energy usage includes at least one of: examining structure of the first data to ensure that required fields are present; detecting gaps in the first data; detecting anomalies in the first data; identifying outliers in the first data; and conducting referential integrity checks on the first data.

In an embodiment, the loading includes storing a first type of the first data relating to energy usage in a relational database.

In an embodiment, the first type of the first data relating to energy usage includes customer data.

In an embodiment, the loading includes storing a second type of the first data relating to energy usage in a key/value store.

In an embodiment, the second type of the first data relating to energy usage includes meter data.

In an embodiment, the loading includes normalizing the second type of the first data relating to energy usage.

In an embodiment, the loading includes storing the normalized second type of the first data relating to energy usage.

In an embodiment, the stream processing includes converting the second data relating to energy usage according to a data model of the energy management platform.

In an embodiment, the stream processing includes persisting the converted second data relating to energy usage.

In an embodiment, the stream processing includes scheduling processing of the second data relating to energy usage based on receipt of an event notification.

In an embodiment, the stream processing includes, using stream processing logic specified by at least one of the energy management platform and a user of the energy management platform, processing the second data relating to energy usage.

In an embodiment, the stream processing includes at least one of: providing an alert based on the processed second data relating to energy usage; persisting the processed second data relating to energy usage; and providing a new stream based on the processed second data relating to energy usage.

In an embodiment, the batch parallel processing includes: receiving a request for a batch job; identifying a data set for the batch job associated with the third data relating to energy usage; and dividing the batch job into batches.

In an embodiment, the batch parallel processing includes scheduling processing of the batches.

In an embodiment, additional computing resources, owned by a third party separate from an entity that owns the computer system that supports the energy management platform, are provisioned based on increasing computing demand. Existing computing resources owned by the third party are released based on decreasing computing demand.

Many other features and embodiments of the invention will be apparent from the accompanying drawings and from the following detailed description.

Figure 1:
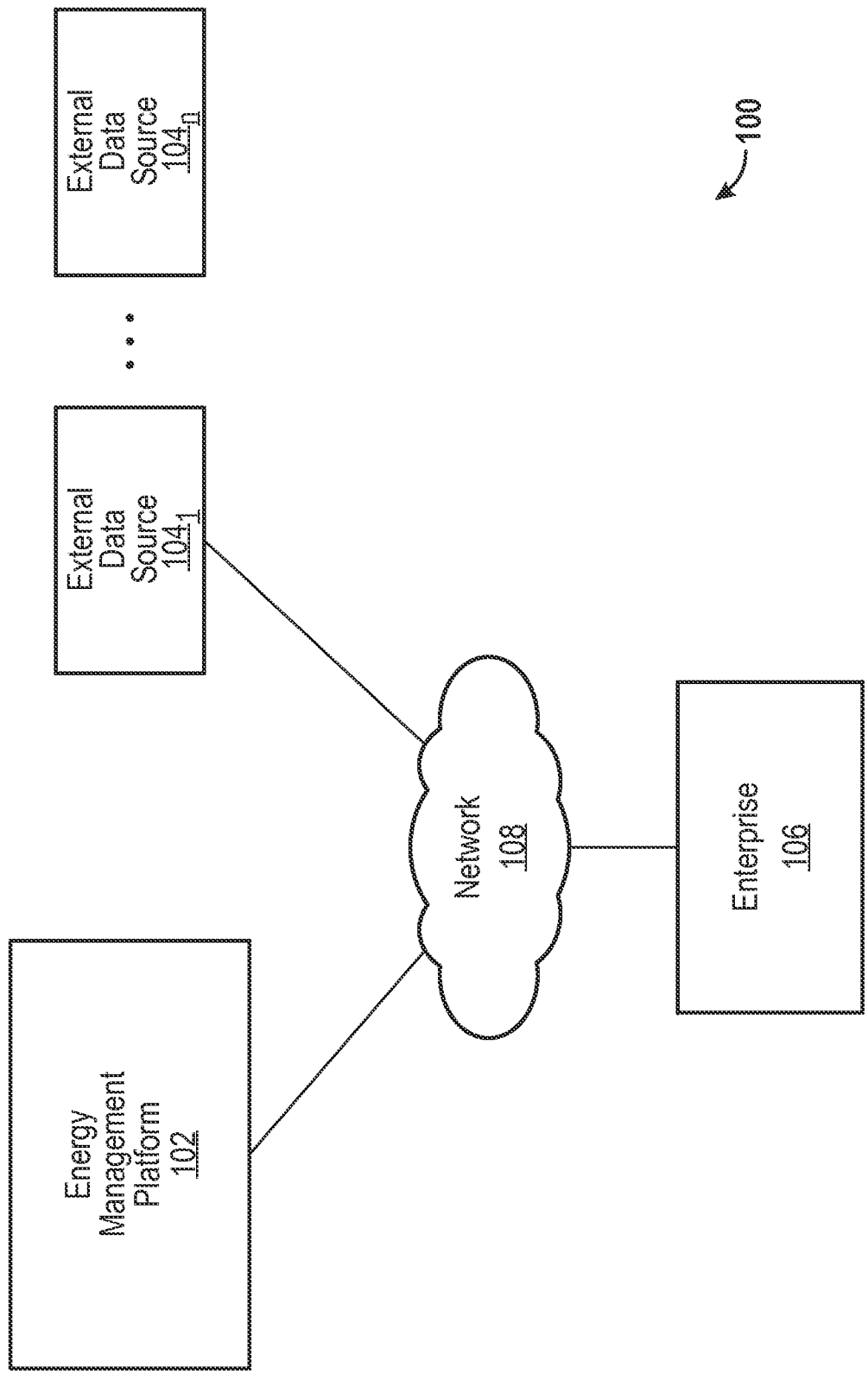
FIG. 1 illustrates an example environment of an energy management platform in accordance with an embodiment of the invention.

The figures depict various embodiments of the present invention for purposes of illustration only, wherein the figures use like reference numerals to identify like elements. One skilled in the art will readily recognize from the following discussion that alternative embodiments of the structures and methods illustrated in the figures may be employed without departing from the principles of the invention described herein.

DETAILED DESCRIPTION

Embodiments of the invention relate to an energy management platform that overcomes disadvantages associated with conventional solutions. In an embodiment, the energy management platform can be implemented as a software-as-a-service (SaaS) solution hosted in the cloud. The energy management platform may provide analytical applications for energy management that are built on a robust architecture.

The energy management platform in accordance with embodiments of the invention provides myriad benefits. In an embodiment, as a SaaS implementation, users of the energy management platform do not have to purchase and maintain hardware or purchase and integrate disparate software packages, reducing upfront costs and the upfront resources required from IT resources, such as an IT team or outside consultants. The energy management platform can be delivered "out-of-the-box", reducing the need to define and produce precise and detailed requirements. The energy management platform may leverage industry best practices and leading capabilities for data integration, which reduces the time required to connect to required data sources. Software maintenance updates and software upgrades may be "pushed" to users of the energy management platform automatically, thereby ensuring that software updates are available to users as quickly as possible.

The energy management platform in accordance with embodiments of the invention provides various capabilities and advantages for an enterprise. Smart meter investment can be leveraged to derive accurate predictive models of building energy performance throughout a region of interest. Energy data can be compiled and aggregated into consolidated and consistent views of building performance across the region. Energy usage can be modeled and forecasted across some or all of the buildings in the region. The energy performance of buildings can be benchmarked against industry standards as well as internal benchmarks of the enterprise. The energy performance of buildings can be compared to identify low-performing outliers for potential energy improvements. The effectiveness of energy improvements can be tracked, measured, and quantified to identify those that provide the highest impact and greatest return on investment. The allocation of the costs and benefits of energy improvements among all stakeholders can be analyzed so that the enterprise, as well as broader constituents, can understand the return on its energy-related investments.

FIG. 1 illustrates an example environment 100 for energy management in accordance with an embodiment of the invention. The environment 100 includes an energy management platform 102, external data sources $104_{1-n}$, an enterprise 106, and a network 108. The energy management platform 102, which is discussed in more detail herein, provides functionality to allow the enterprise 106 to track, analyze, and optimize energy usage of the enterprise 106. The energy management platform 102 may constitute an analytics platform. The analytics platform may handle data management, multi-layered analysis, and data visualization capabilities for all applications of the energy management platform 102. The analytics platform may be specifically designed to process and analyze significant volumes of frequently updated data while maintaining high performance levels.

The energy management platform 102 may communicate with the enterprise 106 through user interfaces (UIs) presented by the energy management platform 102 for the enterprise 106. The UIs may provide information to the enterprise 106 and receive information from the enterprise 106. The energy management platform 102 may communicate with the external data sources $104_{1-n}$ through APIs and other communication interfaces. Communications involving the energy management platform 102, the external data sources $104_{1-n}$, and the enterprise 106 are discussed in more detail herein.

The energy management platform 102 may be implemented as a computer system, such as a server or series of servers and other hardware (e.g., applications servers, analytic computational servers, database servers, data integrator servers, network infrastructure (e.g., firewalls, routers, communication nodes)). The servers may be arranged as a server farm or cluster. Embodiments of the invention may be implemented on the server side, on the client side, or a combination of both. For example, embodiments of the invention may be implemented by one or more servers of the energy management platform 102. As another example, embodiments of the invention may be implemented by a combination of servers of the energy management platform 102 and a computer system of the enterprise 106.

The external data sources $104_{1-n}$ may represent a multitude of possible sources of data relevant to energy management analysis. The external data sources $104_{1-n}$ may include, for example, grid and utility operational systems, meter data management (MDM) systems, customer information systems (CIS), billing systems, utility customer systems, utility enterprise systems, utility energy conservation measures, and rebate databases. The external data sources $104_{1-n}$ also may include, for example, building characteristic systems, weather data sources, third-party property management systems, and industry-standard benchmark databases.

The enterprise 106 may represent a user (e.g., customer) of the energy management platform 102. The enterprise 106 may include any private or public concern, such as large companies, small and medium businesses, households, individuals, governing bodies, government agencies, non-governmental organizations, nonprofits, etc. The enterprise 106 may include energy suppliers (e.g., utilities), energy service companies (ESCOs), and energy consumers. The enterprise 106 may be associated with one or many facilities distributed over many geographic locations. The enterprise 106 may be associated with any purpose, industry, or other type of profile.

The network 108 may use standard communications technologies and protocols. Thus, the network 108 may include links using technologies such as Ethernet, 802.11, worldwide interoperability for microwave access (WiMAX), 3G, 4G, CDMA, GSM, LTE, digital subscriber line (DSL), etc. Similarly, the networking protocols used on the network 108 may include multiprotocol label switching (MPLS), transmission control protocol/Internet protocol (TCP/IP), User Datagram Protocol (UDP), hypertext transport protocol (HTTP), simple mail transfer protocol (SMTP), file transfer protocol (FTP), and the like. The data exchanged over the network 108 may be represented using technologies and/or formats including hypertext markup language (HTML) and extensible markup language (XML). In addition, all or some links may be encrypted using conventional encryption technologies such as secure sockets layer (SSL), transport layer security (TLS), and Internet Protocol security (IPsec).

In an embodiment, each of the energy management platform 102, the external data sources $104_{1-n}$, and the enterprise 106 may be implemented as a computer system. The computer system may include one or more machines, each of which may be implemented as machine 600 of FIG. 6, which is described in further detail herein.

Figure 1A:
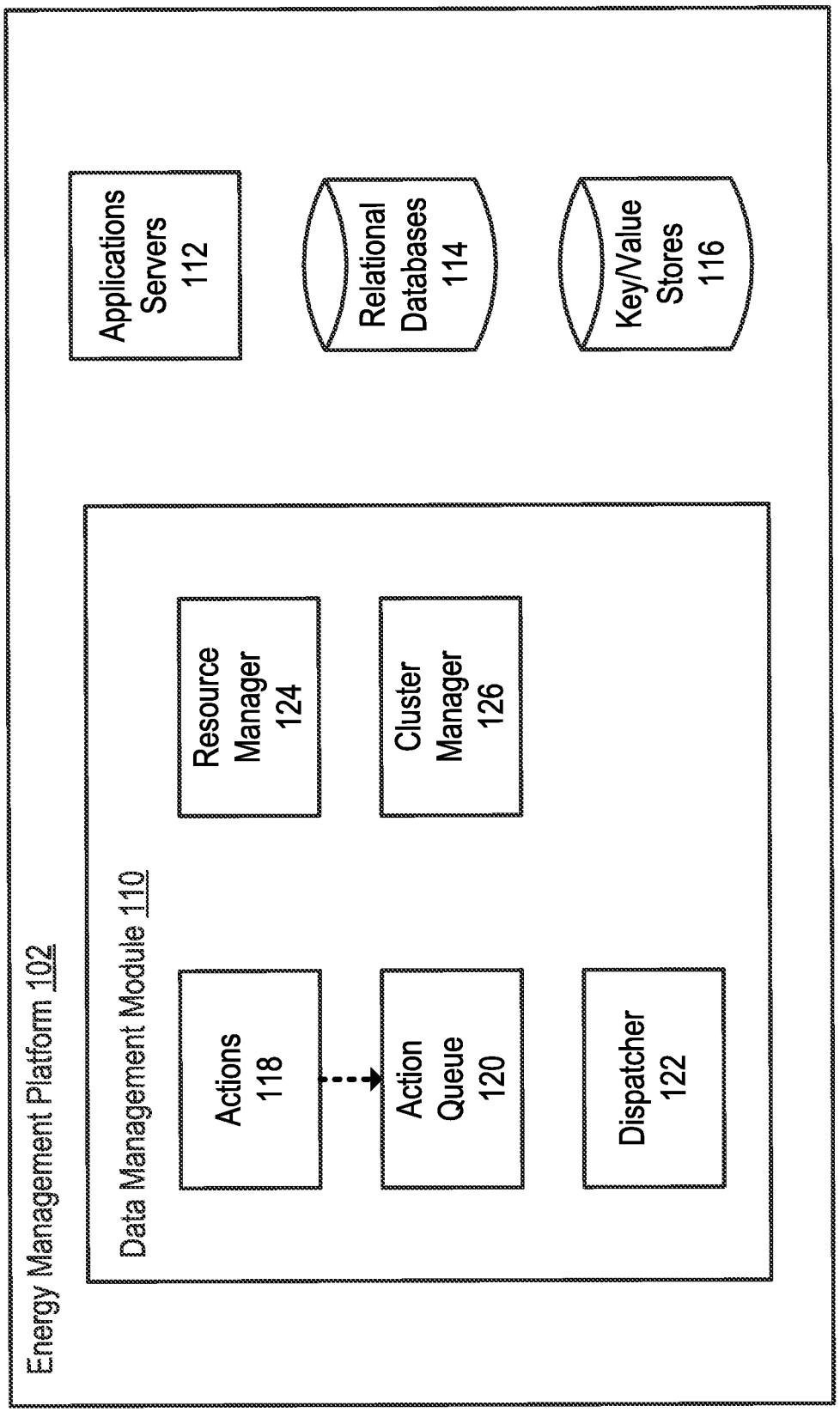
FIG. 1A illustrates an example energy management platform in accordance with an embodiment of the invention.

FIG. 1A illustrates an example energy management platform 102 in accordance with an embodiment of the invention. In an embodiment, the energy management platform 102 may include a data management module 110, applications servers 112, relational databases 114, and key/value stores 116.

The data management module 110 may support the capability to automatically and dynamically scale a network of computing resources for the energy management platform 102 according to demand on the energy management platform 102. The dynamic scaling supported by the data management module 110 may include the capability to provision additional computing resources (or nodes) to accommodate increasing computing demand. Likewise, the data management module 110 may include the capability to release computing resources to accommodate decreasing computing demand. The data management module 110 may include one or more action(s) 118, a queue 120, a dispatcher 122, a resource manager 124, and a cluster manager 126.

The actions 118 may represent the tasks that are to be performed in response to requests that are provided to the energy management platform 102. Each of the actions 118 may represent a unit of work to be performed by the applications servers 112. The actions 118 may be associated with data types and bound to engines (or modules). The requests may relate to any task supported by the energy management platform 102. For example, the request may relate to, for example, analytic processing, loading energy-related data, retrieving an energy star reading, retrieving benchmark data, etc. The actions 118 are provided to the action queue 120.

The action queue 120 may receive each of the actions 118. The action queue 120 may be a distributed task queue and represents work that is to be routed to an appropriate computing resource and then performed.

The dispatcher 122 may associate and hand-off a queued action to an engine that will execute the action. The dispatcher 122 may control routing of each queued action to a particular one of the applications servers 112 based on load balancing and other optimization considerations. The dispatcher 122 may receive an instruction from the resource manager 124 to provision new nodes when the current computing resources are at or above a threshold capacity. The dispatcher 122 also may receive an instruction from the resource manager to release nodes when the current computing resources are at or below a threshold capacity. The dispatcher 122 accordingly may instruct the cluster manager 126 to dynamically provision new nodes or release existing nodes based on demand for computing resources. The nodes may be computing nodes or storage nodes in connection with the applications servers 112, the relational databases 114, and the key/value stores 116.

The resource manager 124 may monitor the action queue 120. The resource manager 124 also may monitor the current load on the applications servers 112 to determine the availability of resources to execute the queued actions. Based on the monitoring, the resource manager may communicate, through the dispatcher 122, with the cluster manager 126 to request dynamic allocation and de-allocation of nodes.

The cluster manager 126 may be a distributed entity that manages all of the nodes of the applications servers 112. The cluster manager 126 may dynamically provision new nodes or release existing nodes based on demand for computing resources. The cluster manager 126 may implement a group membership services protocol. The cluster manager 126 also may perform a task monitoring function. The task monitoring function may involve tracking resource usage, such as CPU utilization, the amount of data read/written, storage size, etc.

The applications servers 112 may perform processes that manage or host analytic server execution, data requests, etc. The engines provided by the energy management platform 102, such as the engines that perform data services, batch processing, stream services, may be hosted within the applications servers 112. The engines are discussed in more detail herein.

In an embodiment, the applications servers 112 may be part of a computer cluster of a plurality of loosely or tightly connected computers that are coordinated to work as a system in performing the services and applications of the energy management platform 102. The nodes (e.g., servers) of the cluster may be connected to each other through fast local area networks ("LAN"), with each node running its own instance of an operating system. The applications servers 112 may be implemented as a computer cluster to improve performance and availability over that of a single computer, while typically being more cost-effective than single computers of comparable speed or availability. The applications servers 112 may be software, hardware, or a combination of both.

The relational databases 114 may maintain various data supporting the energy management platform 102. In an embodiment, non-time series data may be stored in the relational databases 114, as discussed in more detail herein.

The key/value stores 116 may maintain various data supporting the energy management platform 102. In an embodiment, time series data (e.g., meter readings, meter events, etc.) may be stored in the key/value store, as discussed in more detail herein. In an embodiment, the key/value stores 116 may be implemented with Apache Cassandra, an open source distributed database management system designed to handle large amounts of data across a multitude of commodity servers. In an embodiment, other database management systems for key/value stores may be used.

In an embodiment, one or more of the applications servers 112, the relational databases 114, and the key/value stores 116 may be implemented by the entity that owns, maintains, or controls the energy management platform 102.

In an embodiment, one or more of the applications servers 112, the relational databases 114, and the key/value stores 116 may be implemented by a third party that may provide a computing environment for lease to the entity that owns, maintains, or controls the energy management platform 102. In an embodiment, the applications servers 112, the relational databases 114, and the key/value stores 116 implemented by the third party may communicate with the energy management platform 102 through a network, such as the network 108.

The computing environment provided by the third party for the entity that owns, maintains, or controls the energy management platform 102 may be a cloud computing platform that allows the entity that owns, maintains, or controls the energy management platform 102 to rent virtual computers on which to run its own computer applications. Such applications may include, for example, the applications performed by the applications server 200, as discussed in more detail herein. In an embodiment, the computing environment may allow a scalable deployment of applications by providing a web service through which the entity that owns, maintains, or controls the energy management platform 102 can boot a virtual appliance used to create a virtual machine containing any software desired. In an embodiment, the entity that owns, maintains, or controls the energy management platform 102 may create, launch, and terminate server instances as needed, paying based on time usage time, data usage, or any combination of these or other factors. The ability to provision and release computing resources in this manner supports the ability of the energy management platform 102 to dynamically scale according to the demand on the energy management platform 102.

Figure 2:
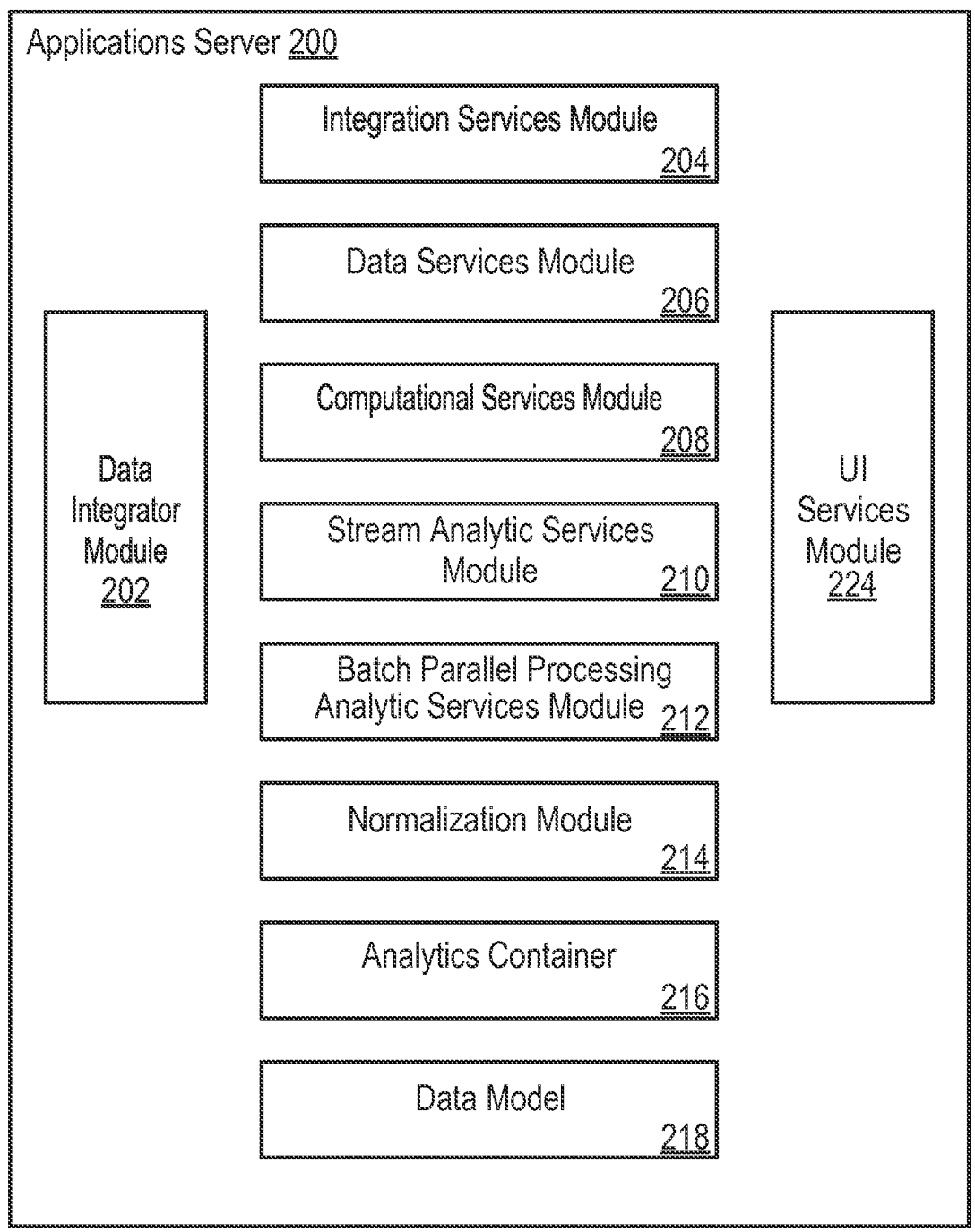
FIG. 2 illustrates an example applications server of an energy management platform in accordance with an embodiment of the invention.

FIG. 2 illustrates an example applications server 200 of an energy management platform in accordance with an embodiment of the invention. In an embodiment, one or more of the applications servers 112 may be implemented with applications server 200. The energy management platform 102 includes a data integrator (data loading) module 202, an integration services module 204, a data services module 206, a computational services module 208, a stream analytic services module 210, a batch parallel processing analytic services module 212, a normalization module 214, an analytics container 216, a data model 218, and a user interface (UI) services module 224.

The analytics platform supported by the applications server 200 includes multiple services that each handles a specific data management or analysis capability. The services include the data integrator module 202, the integration services module 204, the data services module 206, the computational services module 208, the stream analytic services module 210, batch parallel processing analytic services module 212, and the UI services module 224. All or some services within the analytics platform may be modular and accordingly architected specifically to execute their respective capabilities for large data volumes and at high speed. The services may be optimized in software for high performance distributed computing over a computer cluster including the applications servers 112.

The modules and components of the applications server 200 in FIG. 2 and all the figures herein are merely exemplary, and may be variously combined into fewer modules and components, or separated into additional modules and components. The described functionality of the modules and components may be performed by other modules and components.

The data integrator module 202 is a tool for automatically importing data maintained in software systems or databases of the external data sources $104_{1-n}$ into the energy management platform 102. The imported data may be used for various applications of the energy management platform 102 or the application server 200. The data integrator module 202 accepts data from a broad range of data sources, including grid and operational systems such as MDM, CIS, and billing systems, as well as third-party data sources such as weather databases, building databases (e.g., Urban Planning Council database), third-party property management systems, and external benchmark databases. The imported data may include, for example, meter data (e.g., electricity consumption, water consumption, natural gas consumption) provided at minimum daily or other time intervals (e.g., 15-minute intervals), weather data (e.g., temperature, humidity) at daily or other time intervals (e.g., hourly intervals), building data (e.g., square footage, occupancy, age, building type, number of floors, air conditioned square footage), aggregation definitions (hierarchy) (e.g., meters to building, buildings to city block, building's regional identification), and asset data (e.g., number and type of HVAC assets, number and type of production units (for plants)).

The data integrator module 202 also has the ability to import information from flat files, such as Excel spreadsheets, and has the ability to capture information entered directly into an application of the energy management platform 102. By incorporating data from a broad array of sources, the application server 200 is capable of performing complex and detailed analyses, enabling greater business insights.

The data integrator module 202 provides a set of standardized canonical object definitions (standardized interface definitions) that can be used to load data into applications of the application server 200. The canonical objects of the data integrator module 202 may be based on current or emerging utility industry standards, such as the Common Information Model (CIM), Green Button, and Open Automatic Data Exchange, or on the specifications of the application server 200. The application server 200 may support these and other standards to ensure that a broad range of utility data sources will be able to connect easily to the energy management platform 102. Canonical objects may include, for example:

| CANONICAL OBJECT | DEFINITION AND DESCRIPTION |
|---|---|
| Organization | An individual entity or sub entity involved in the consumption of energy.<br>Example data source: Customer Information System (CIS).<br>Associated data includes: name, organizational hierarchy, organizational identification number, primary contact, contact information. |
| Facility | A facility such as an office, data center, hospital, etc. A facility is placed at a location and is owned or leased by an organization.<br>Example data sources: CIS, billing system, data warehouse.<br>Associated data includes: facility name, mailing address, ownership, facility identification number, service address, building characteristics such as floor area, longitude/latitude, date of construction. |

-continued

| CANONICAL OBJECT | DEFINITION AND DESCRIPTION |
| --- | --- |
| Service | Agreements an organization has with a utility. Example data sources: billing system, data warehouse. Associated data includes: service account number, billing account number, bill-to accounts, types of services provided (electricity, natural gas, water), associated meters and facilities. |
| Billing | Vendor data as presented on utility bills. Example data source: billing system. Associated data includes: start date, end date, billed consumption, billed demand, peak demand, reactive demand, taxes and fees, bill number. |
| UsagePoint | The resource-consuming entity for which interval data is provided. Example data sources: meter data management system (MDM). Associated data includes: asset associated with meter, type of resource measured (electricity, natural gas), measurement methodology, unit of measure. |
| MeterReading | A unique type of measurement - for example, power (kW), consumption (kWh), voltage, temperature, etc. A MeterReading contains both measurement values and timestamps. Example data sources: MDM. Associated data includes: resource consumption data, resource demand data, time period. |
| Energy Conservation Measure | An action undertaken to reduce the energy consumption and spend. Example data sources: data warehouse, spreadsheets. Associated data includes: project name, project type, estimated cost, estimated resource savings, estimated financial savings, simple payback, return on investment, measure lifetime, facility. |
| External Benchmark | Industry standard benchmark data. External Benchmarks can apply for a whole facility or can apply to an end-use category. Example data sources: third party databases. Associated data includes: facility type, building size, climate region, building vintage, end use, end use energy intensity, whole building energy intensity, energy cost intensity, whole building energy cost intensity. |
| Region | User-defined geographic area where an organization does business. Hierarchy of subsections that allows the creation of aggregated analyses. Data source: CIS, data warehouse. Associated data includes: region definitions, parent/child relationship definitions. |

Once the data in canonical form is received, the data integrator module 202 may transform the data into individual data entities in accordance with the data model 218 so that the data can be loaded into a database schema to be stored, processed, and analyzed.

The data integrator module 202 is capable of handling very high volumes of data (e.g., "big data"). For example, the data integrator module 202 may frequently process interval data from millions of digital meters. To receive data, the application server 200 may provide a consistent secured web service API (e.g., REST). Integration can be carried out in an asynchronous batch or real-time mode. The data integrator module 202 may incorporate real-time and batch data from, for example, utility customer systems, building characteristic systems, industry-standard benchmark systems, utility energy conservation measures and rebate databases, utility enterprise systems, MDM, and utility operational systems. When an external data source does not possess an API or computerized means by which to extract data, the application server 200 can pull data directly from a web page associated with the external data source (e.g., by using web scraping).

The data integrator module 202 also may perform initial data validation. The data integrator module 202 may examine the structure of the incoming data to ensure that required fields are present and that the data is of the right data type. For example, the data integrator module 202 may recognize when the format of the provided data does not match the expected format (e.g., a number value is erroneously provided as text), prevents the mismatched data from being loaded, and logs the issue for review and investigation. In this way, the data integrator module 202 may serve as a first line of defense in ensuring that incoming data meets the requirements for accurate analysis.

The integration services module 204 serves as a second layer of data validation or proofing, ensuring that data is error-free before it is loaded into a database or store. The integration services module 204 receives data from the data integrator module 202, monitors the data as it flows in, performs a second round of data checks, and passes data to the data services module 206 to be stored.

The integration services module 204 may provide various data management functions. The integration services module 204 may perform duplicate handling. The integration services module 204 may identify instances of data duplication to ensure that analysis is accurately conducted on a singular data set. The integration services module 204 can be configured to process duplicates according to business requirements specified by a user (e.g., treating two duplicate records as the same or averaging duplicate records). This flexibility allows the application server 200 to conform to customer standards for data handling.

The integration services module 204 may perform data validation. The integration services module 204 can detect data gaps and data anomalies (e.g., statistical anomalies), identify outliers, and conduct referential integrity checks. Referential integrity checking ensures that data has the correct network of associations to enable analysis and aggregation, such as ensuring that loaded meter data is associated with a facility or, conversely, that facilities have associated meters. The integration services module 204 resolves data validation issues according to the business requirements specified by a user.

The integration services module 204 may perform data monitoring. The integration services module 204 can provide end-to-end visibility throughout the entire data loading process. Users can monitor a data integration process as it progresses from duplicate detection through to data storage. Such monitoring helps to ensure that data is loaded properly and is free of duplication and validation errors.

The data services module 206 is responsible for persisting (storing) large and increasing volumes of data, while also making data readily available for analytical calculations. The data services module 206 partitions data into relational and non-relational (key/value store) databases and also performs operations on stored data. These operations include creating, reading, updating, and deleting data. A data engine of the data services module 206 may persist data for stream processing. The data engine of the data services module 206 also may identify a data set to be processed in connection with a batch job for batch parallel processing.

The data services module 206 may perform data partitioning. The data services module 206 takes advantage of relational and non-relational data stores, such as the relational database 114 and the key/value store 116. By "partitioning" the data into two separate data stores, the relational database 114 and the key/value store 116, the application server 200 ensures that its applications can efficiently process and analyze the large volumes of data, such as interval data originating from meters and grid sensors. The data in the relational database 114 and the key/value store 116 is stored in accordance with the data model 218 of the energy management platform 102.

The relational database 114 is designed to manage structured and slow-changing data. Examples of such data include organization (e.g., customer) and facility data. Relational databases, like the relational database 114, are designed for random access updates.

The key/value store 116 is designed to manage very large volumes of interval (time-series) data, such as meter and grid sensor data. Key/value stores, like the key/value store 116, are designed for large streams of "append only" data that are read in a particular order. "Append only" refers to new data that is simply added to the end of an associated file. By using the dedicated key/value store 116 for interval data, the application server 200 ensures that this type of data is stored efficiently and can be accessed quickly.

The data services module 206 may perform distributed data management. The data services module 206 may include an event queue that schedules provision of notifications to perform stream processing and batch parallel processing. With respect to batch parallel processing, the scheduling may be based on rules that account for the availability of processing resources in an associated cluster in the energy management platform 102. As data volumes grow, the data services module 206 automatically adds nodes to the cluster to accommodate (e.g., store and process) the new data. As nodes are added, the data services module 206 automatically rebalances and partitions the data across all nodes, ensuring continued high performance and reliability.

The computational services module 208 is a library of analytical functions that are invoked by the stream analytic services module 210 and the batch parallel processing analytic services module 212 to perform business analyses. The functions can be executed individually or combined to form complex analyses. The services provided by the computational services module 208 may be modular (i.e., dedicated to a single task) so that the computational services module 208 can parallel process a large number of computations simultaneously and quickly, which allows for significant computational scalability.

The computational services module 208 also may leverage distributed processing to create even greater scalability. For example, if a user is interested in calculating the average annual electricity use for hundreds of thousands of meters, the energy management platform 102 is capable of rapidly responding by distributing the request across multiple servers.

The stream analytic services module 210 performs sophisticated analyses on real-time and near-real-time streams of data. A stream may represent, for example, a feed of high volume data from a meter, sub-meter, or grid sensor. In an embodiment, the stream may be a Supervisory Control and Data Acquisition (SCADA) feed of data. The stream analytic services module 210 may be invoked to analyze this data when the analysis needs to be conducted soon after the data is generated.

The stream analytic services module 210 may include a stream processor to convert the stream into data that is in accordance with the data model 218. The stream analytic services module 210 also may include stream processing logic, which can be provided by a user of the energy management platform 102. The stream processing logic may provide a calculated result that can be persisted and used for subsequent analysis. The stream processing logic also may provide an alert based on a calculated result. For example, a utility may want to receive alerts and on-the-fly analysis when there is an unexpected and significant drop or spike in load. This load variation could be caused by a malfunctioning piece of equipment or sudden damage to equipment, and could possibly represent great risk to the distribution system or an end customer. Data about the unexpected load change can be rapidly recognized, analyzed, and used to send the necessary alert. The stream processing logic also may provide, after processing the original stream, a new stream based on the processed original stream for another purpose or application of the energy management platform 102.

The stream analytic services module 210 may perform near real-time, continuous processing. Because processing by the stream analytic services module 210 occurs very quickly after the data arrives, time-sensitive, high priority analyses provided by the energy management platform 102 are relevant and actionable.

The stream analytic services module 210 may provide horizontal scalability. In order to manage large volumes of data simultaneously, processing by the stream analytic services module 210 can be distributed throughout a server cluster, a set of computers working together.

The stream analytic services module 210 may provide fault tolerance. Streams may be persisted. If a processing failure occurs on one node (e.g., a computer in a cluster), the workload will be distributed to other nodes within the cluster with no loss of data. A stream may be discarded after the processing performed on the stream is completed.

A non-limiting example is provided to illustrate performance of the stream analytic services module 210. Assume streams of recently generated electricity consumption and demand data. The streams may be provided to an event queue associated with the data services module 206. When the data arrives into the event queue, automatic analytic processes are triggered. Multiple analytic processes, or analyses, can be run upon the same data set. The analytic processes may be performed in parallel. Parallel processing on the same data set enables faster processing of multiple analyses. The outputs of these analytic processes may be alerts and calculations that are then stored in a database and made available to designated end users as analysis results. The analytic processes and processing tasks may be distributed across multiple servers that support the stream analytic services module 210. In this way, large data volumes can be rapidly processed by the stream analytic services module 210.

The batch parallel processing analytic services module 212 may perform a substantial portion of analysis required by users of the energy management platform 102. The batch parallel processing analytic services module 212 may analyze large data sets comprised of current and historical data to create reports and analyses, such as periodic Key Performance Indicator (KPI) reporting, historical electricity use analysis, forecasts, outlier analysis, energy efficiency project financial impact analysis, etc. In an embodiment, the batch parallel processing analytic services module 212 may be based on MapReduce, a programming model for processing large data sets and distributing computations on one or more clusters of computers. The batch parallel processing analytic services module 212 automatically performs the tasks of parallelization, fault-tolerance, and load balancing, thereby improving the performance and reliability of processing-intensive tasks.

A non-limiting example is provided to illustrate performance of the batch parallel processing analytic services module 212. As examples, a benchmark analysis of energy intensity, a summary of performance against key performance indicators, and an analysis of unbilled energy due to nontechnical losses could be jobs handled by the batch parallel processing analytic services module 212. When a batch processing job is invoked in the energy management platform 102, an input reader associated with the batch parallel processing analytic services module 212 breaks down the processing job into multiple smaller batches. This break down reduces the complexity and processing time of the job. Each batch is then handed to a worker process to perform its assigned task (e.g., a calculation or evaluation). The results are then "shuffled," which refers to rearrangement of the data set so that the next set of worker processes can efficiently complete the calculation (or evaluation) and quickly write results to a database through an output writer.

The batch parallel processing analytic services module 212 can distribute worker processes across multiple servers. Such distributed processing is employed to fully utilize the computational power of the cluster and to ensure that calculations are completed quickly and efficiently. In this way, the batch parallel processing analytic services module 212 provides scalability and high performance.

The normalization module 214 may normalize meter data that is to be maintained in the key/value store 116. For example, normalization of meter data may involve filling in gaps in the data and addressing outliers in the data. For example, if meter data is expected at consistent intervals but data actually provided to the energy management platform 102 does not have meter data at certain intervals, the normalization module 214 may apply certain algorithms (e.g., interpolation) to provide the missing data. As another example, aberrational values of energy usage can be detected and addressed by the normalization module 214. In an embodiment, normalization performed by the normalization module 214 may be configurable. For example, the algorithms (e.g., linear, non-linear) used by the normalization module 214 may be specified by an administrator or a user of the energy management platform 102. Normalized data may be provided to the key/value store 116.

The analytics container 216 may perform analytic processing. The analytics container 216 may include a machine learning module (not shown) that implements one or more varieties of machine learning algorithms to enhance energy and smart grid analytics. In an embodiment, the machine learning module may perform a plurality of processing steps including prediction followed by feedback and learning.

In an embodiment, prediction may include feature extraction, classification, and ranking. With respect to extraction, analytic processing may be performed on meter datasets, event datasets or other datasets. The data sets may include information from grid and operational systems, such as MDM, CIS, and other types of data identified herein. The datasets may be used to identify signatures of theft, consumption, demand, or other features such as consumption on inactive meter, tamper events, drop in consumption, producer at night, etc. The datasets may be based on data maintained in the relational databases 114 and the key/value stores 116. With respect to classification, different features may be selectively merged or weighted, and elements may be grouped to generate a set of follow-up opportunities. With respect to ranking, resulting opportunities may be prioritized based on the preferences and business operations of the enterprise 106. In an embodiment, prediction may be performed by the energy management platform 102.

In an embodiment, feedback may involve investigation by the enterprise 106 (e.g., utility) resulting in empirical data regarding energy usage or smart grid operation or conditions. The results of investigation may allow for the provision by the enterprise 106 of feedback to the machine learning module to adjust learned detection parameters.

The UI services module 224 provides the graphical framework for all applications of the energy management platform 102. The UI services module provides visualization of analytical results so that end users may receive insights that are clear and actionable. After analyses are completed by the stream analytic services module 210 or the batch parallel processing analytic services module 212, they may be graphically rendered by the UI services module 224, provided to the appropriate application of the energy management platform 102, and ultimately presented on a computer system (e.g., machine) of the user. This delivers data insights to users in an intuitive and easy-to-understand format.

The UI services module 224 provides many features. The UI services module 224 may provide a library of chart types and a library of page layouts. All variations in chart types and page layouts are maintained by the UI services module 224. The UI services module 224 also may provide page layout customization. Users, such as administrators, can add, rename, and group fields. For example, the energy management platform 102 allows a utility administrator to group energy intensity, energy consumption, and energy demand together on a page for easier viewing. The UI services module 224 may provide role-based access controls. Administrators can determine which parts of the application will be visible to certain types of users. Using these features, the UI services module 224 ensures that end users enjoy a consistent visual experience, have access to capabilities and data relevant to their roles, and can interact with charts and reports delivering clear business insights.

Figure 3:
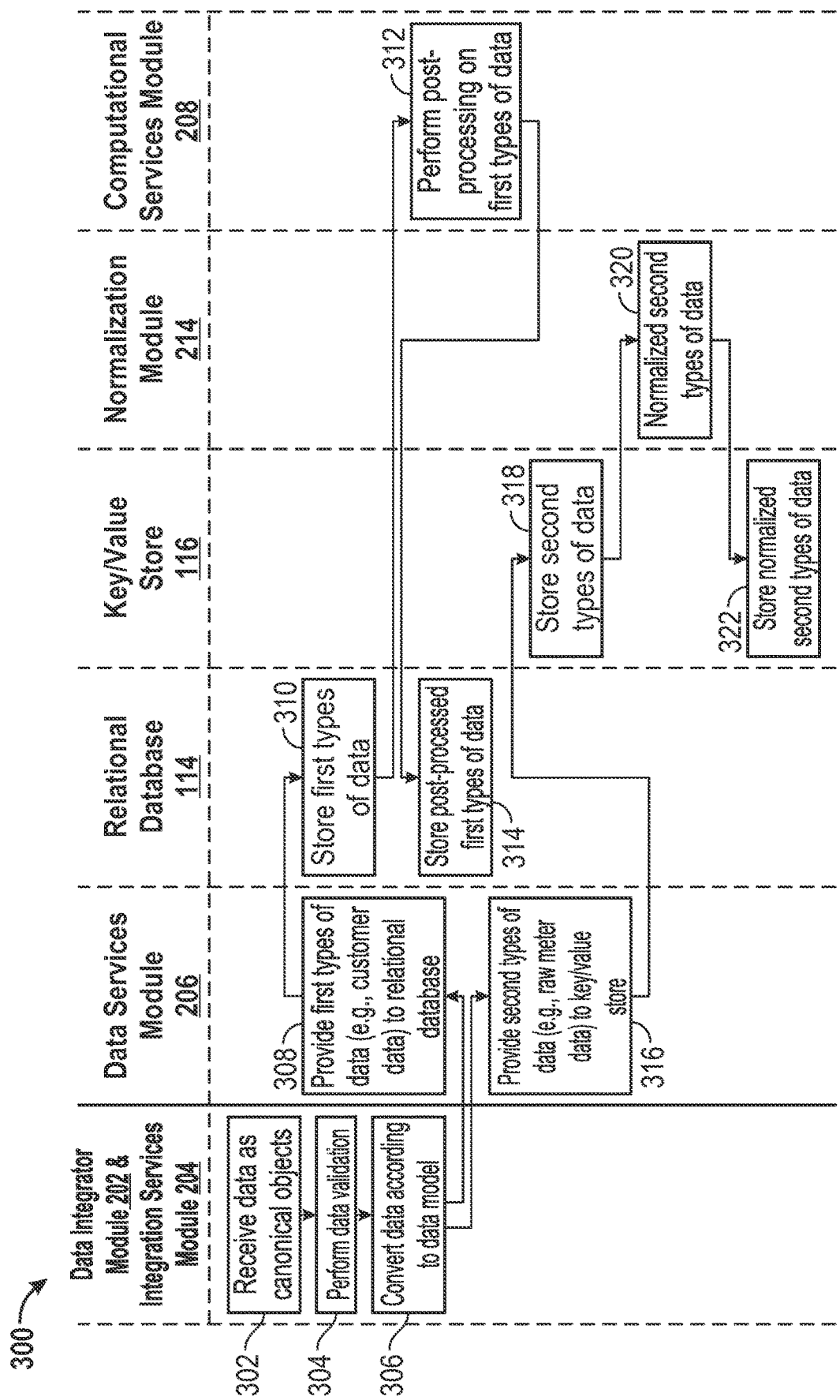
FIG. 3 illustrates an example data loading process in accordance with an embodiment of the invention.

FIG. 3 illustrates an example process 300 for data loading in accordance with an embodiment of the invention. At block 302, the data integrator module 202 and the integration services module 204 receive data relating to energy usage as canonical objects. The canonical objects may be consistent with industry standards or specifications unique to the energy management platform 102. At block 304, the data integrator module 202 and the integration services module 204 perform different tasks, such as initial data validation, duplicate handling, and subsequent data validation on the received data. At block 306, the data integrator module 202 converts the data according to the data model 218. For first types of data, the process 300 proceeds from block 306 to block 308. At block 308, the data services module 206 provides the first types of data to the relational database 114. One example type of the first types of data is customer data relating to an energy usage account. Other examples of data stored in the relational database 114 may include information concerning organizations and organization hierarchies, grid assets and grid asset hierarchies, service agreements, billing accounts, and meter characteristics. At block 310, the relational database 114 stores the first types of data.

At block 312, the computational services module 208 performs post-processing on the first types of data. The stored first types of data may be post-processed to derive any kind of information that may be requested by an application of the energy management platform 102. Post-processing may include, for example, aggregate calculations and performance denormalization performed on the stored first types of data. Aggregate calculations may include, for example, summing periodic energy expenditures (e.g., monthly bills) into a total figure (e.g., annual amounts). Performance denormalization may include, for example, processing of the stored first types of data to optimize query performance. Other types of post-processing are possible. At block 314, the relational database 114 stores the post-processed first types of data.

For second types of data, the process 300 proceeds from block 306 to block 316. At block 316, the data services module 206 provides the second types of data to the key/value store 116. One example type of the second types of data is "raw" meter data relating to energy usage. Other examples of data stored in the key/value store 116 may include meter readings, meter events, weather measurements such as temperature, relative humidity, dew point, downward infrared irradiance, and asset state changes. At block 318, the key/value store 116 stores the second types of data. At block 320, the normalization module 214 normalizes the second types of data. Normalization may involve, for example, filling in gaps or addressing outliers in the data. The normalization algorithms may be provided by the energy management platform 102 or the user. At block 322, the key/value store 116 stores the normalized second types of data.

The process 300 can be used in various circumstances. For example, the data provided by the external data sources $104_{1-n}$, as appropriate, can be received and processed by the energy management platform 102 in accordance with the process 300. Further, suitable portions of the process 300 can apply to data derived from other data processing techniques of the energy management platform 102, such as stream processing and batch parallel processing. Many other uses of the process 300 are possible in addition to the examples discussed herein. For example, other uses of the process 300 may include weather measurements, meter events, energy efficiency measures, grid assets, phasor management unit measurements, and customer information.

Figure 4:
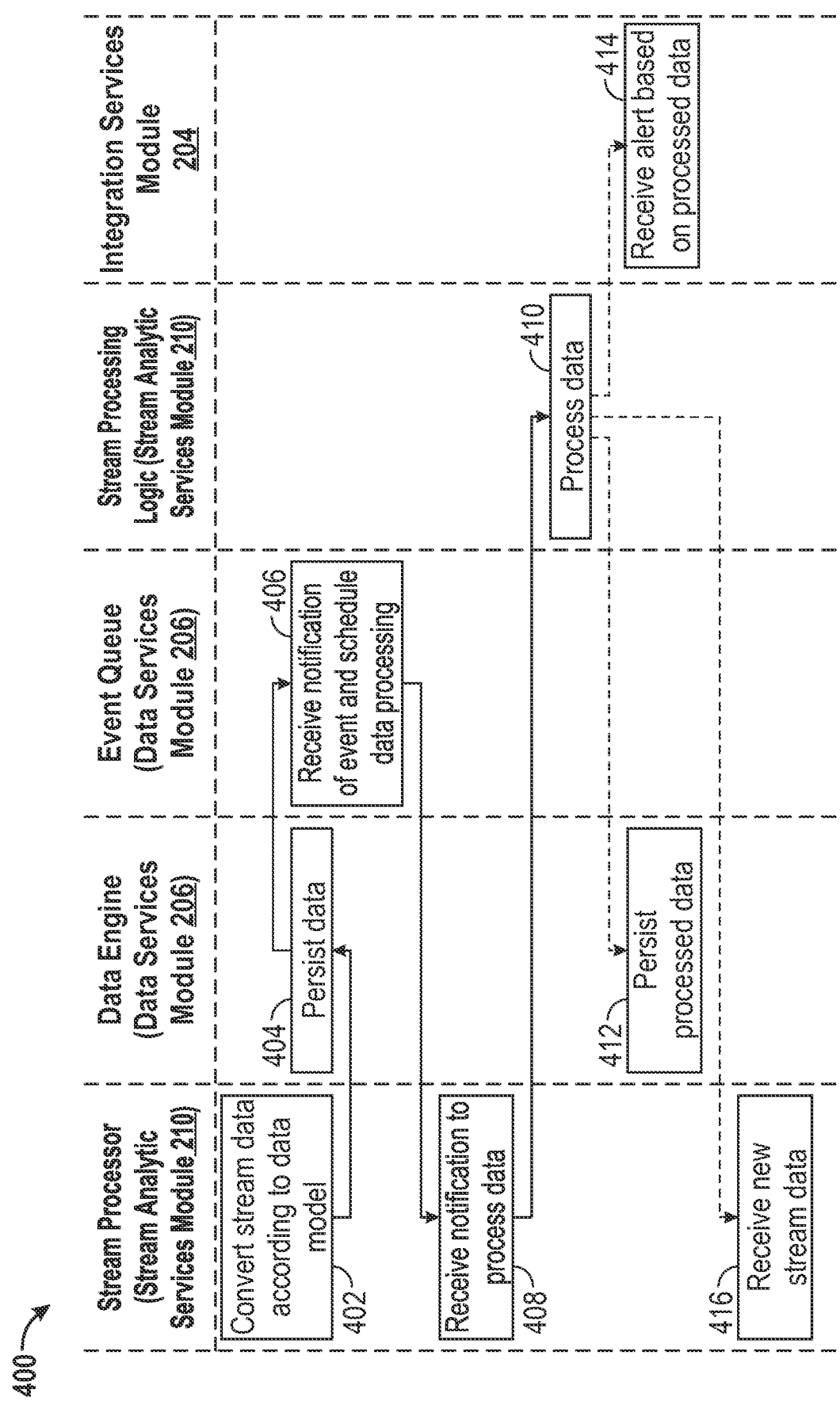
FIG. 4 illustrates an example stream process in accordance with an embodiment of the invention.

FIG. 4 illustrates an example process 400 for stream processing in accordance with an embodiment of the invention. A stream, such as a SCADA feed, is provided to the stream processor of the stream analytic services module 210. At block 402, the stream processor of the stream analytic services module 210 converts the stream according to the data model 218. At block 404, the data engine of the data services module 206 persists the data in the event queue. The data is persisted in the event queue until the processing of the stream is complete, at which time the data may be discarded. At block 406, the event queue of the data services module 206 receives notification of an event, such as completed persistence of the data, and schedules data processing. According to the schedule, the event queue provides to the stream processor of the stream analytic services module 210 a notification to process the data.

At block 408, the stream processor of the stream analytic services module 210 receives the notification to process the data. The notification provided to the stream processor may be based on scheduling logic of the event queue that accounts for load balancing for and availability of computing resources to process the data. The stream processor of the stream analytic services module 210 provides an instruction to the stream processing logic of the stream analytic services module 210 to process the data. At block 410, the stream processing logic of the stream analytic services module 210 processes the data. The stream processing logic may be based on any specifications of the user or an administrator of the energy management platform 102.

The process 400 proceeds to one or more of block 412, block 414, and block 416, which represent examples of different actions that can be taken by the stream processing logic. At block 412, the data engine of the data services module 206 persists the processed data. The processed data may be persisted in the relational database 114 or the key/value store 116. At block 414, the integration services module 204 receives from the stream processing logic an indication of an event, such as an alert, based on the processed data. The alert, in turn, may trigger the integration services module 204 to take action, such as notifying an application or resource, internal or external to the energy management platform 102, about a real-time or near real-time condition relating to energy usage or management. At block 416, the stream processor of the stream analytic services module 210 receives a new stream of data based on the processed data. In response to receipt of the new stream of data, the process 400 may proceed to block 402 to initiate another cycle of the process 400.

The process 400 can be used in various situations. In one example situation, energy loss may be evidence or caused by myriad occurrences, such as energy usage readings on inactive meters (e.g., AMR, AMI), tampered or bypassed meters, and malfunctioning meters. Stream processing in accordance with the process 400 can allow for rapid identification of meters potentially associated with energy loss. With respect to persisting data, a table could be created that stores the identification of the meters associated with energy loss and their related meter data. The table then could be persisted for use by an application of the energy management platform 102. With respect to provision of alerts, once meters associated with energy loss are identified, the process 400 may generate alerts that prompt communications to appropriate field personnel to be dispatched to investigate such meters. In another example situation, a stream of meter data may need to be converted for use as a new stream. With respect to generating a new stream, meter data provided at, for example, 15-minute intervals can be converted to a new stream of aggregated meter data reflecting, for example, one hour intervals. The new stream, in turn, may be processed in accordance with the process 400 and the stream processing logic associated with the new stream. Many other uses of the process 400 are possible in addition to the examples discussed herein. For example, other uses of the process 400 may include: identification and quantification of unbilled energy due to theft and malfunction; identification of opportunities to reduce operational and capital expense by right-sizing system voltage and power factor; estimation of load predication and potential load reduction at multiple aggregation levels; computation of outage metrics by region within the grid distribution system; and examination of dynamic load patterns, voltage abnormalities, and optimal equipment capacities to create a profile of the health of grid assets.

Figure 5:
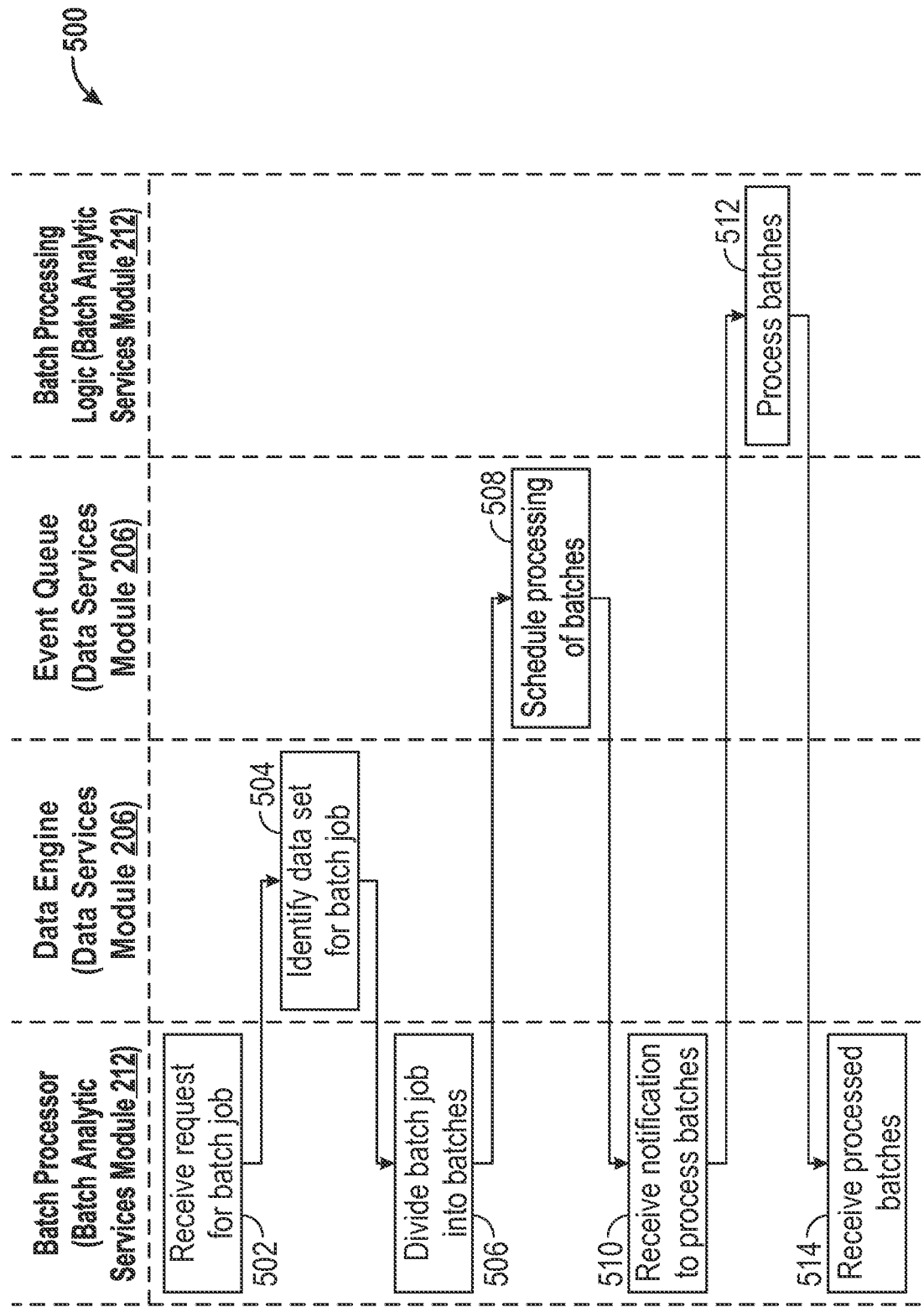
FIG. 5 illustrates an example batch parallel process in accordance with an embodiment of the invention.

FIG. 5 illustrates an example process 500 for batch parallel processing in accordance with an embodiment of the invention. The process 500 may be invoked in any manner, such as through a command from a user interface, a scheduler (e.g., cron), or an API. At block 502, the batch processor of the batch parallel processing analytic services module 212 receives a request for a batch job. At block 504, the data engine of the data services module 206 identifies a data set for the batch job. At block 506, the batch processor of the batch parallel processing analytic services module 212 divides the batch job into batches. At block 508, the event queue of the data services module 206 schedules processing of the batches. According to the schedule, the event queue provides to the batch processor of the batch parallel processing analytic services module 212 a notification to process the batches.

At block 510, the batch processor of the batch parallel processing analytic services module 212 receives the notification to process the batches. The notification provided to the batch processor may be based on scheduling logic of the event queue that accounts for load balancing for and availability of computing resources to process the data. The batch processor of the batch parallel processing analytic services module 212 provides an instruction to the batch processing logic of the batch parallel processing analytic services module 212 to process the batches. At block 512, the batch processing logic of the batch parallel processing analytic services module 212 processes the batches. The batch processing logic may be based on any specifications of the user or an administrator of the energy management platform 102. At block 514, the batch processor of the batch parallel processing analytic services module 212 receives the processed batches. The processed batches may be used in accordance with an application of the energy management platform 102.

The process 500 can be used in various situations. For example, reports relating energy usage can be generated on, for example, a daily, monthly, or yearly basis using batch parallel processing. In this regard, the reports generated by batch parallel processing may aggregate, analyze, and compare data across any number of KPIs, such as periodic (e.g., yearly) energy cost, periodic (e.g., yearly) energy consumption, periodic (e.g., year over year) change in energy cost, periodic (e.g., year over year) change in consumption, energy cost per square area, and energy consumption per square area. Many other uses of the process 500 are possible in addition to the examples discussed herein. For example, other uses of the process 500 may include generation of energy efficiency recommendations across a portfolio of facilities; evaluation of load forecasting statistical models across a portfolio of meters to determine load shedding opportunities; and customer segmentation identification and evaluation.

Figure 6:
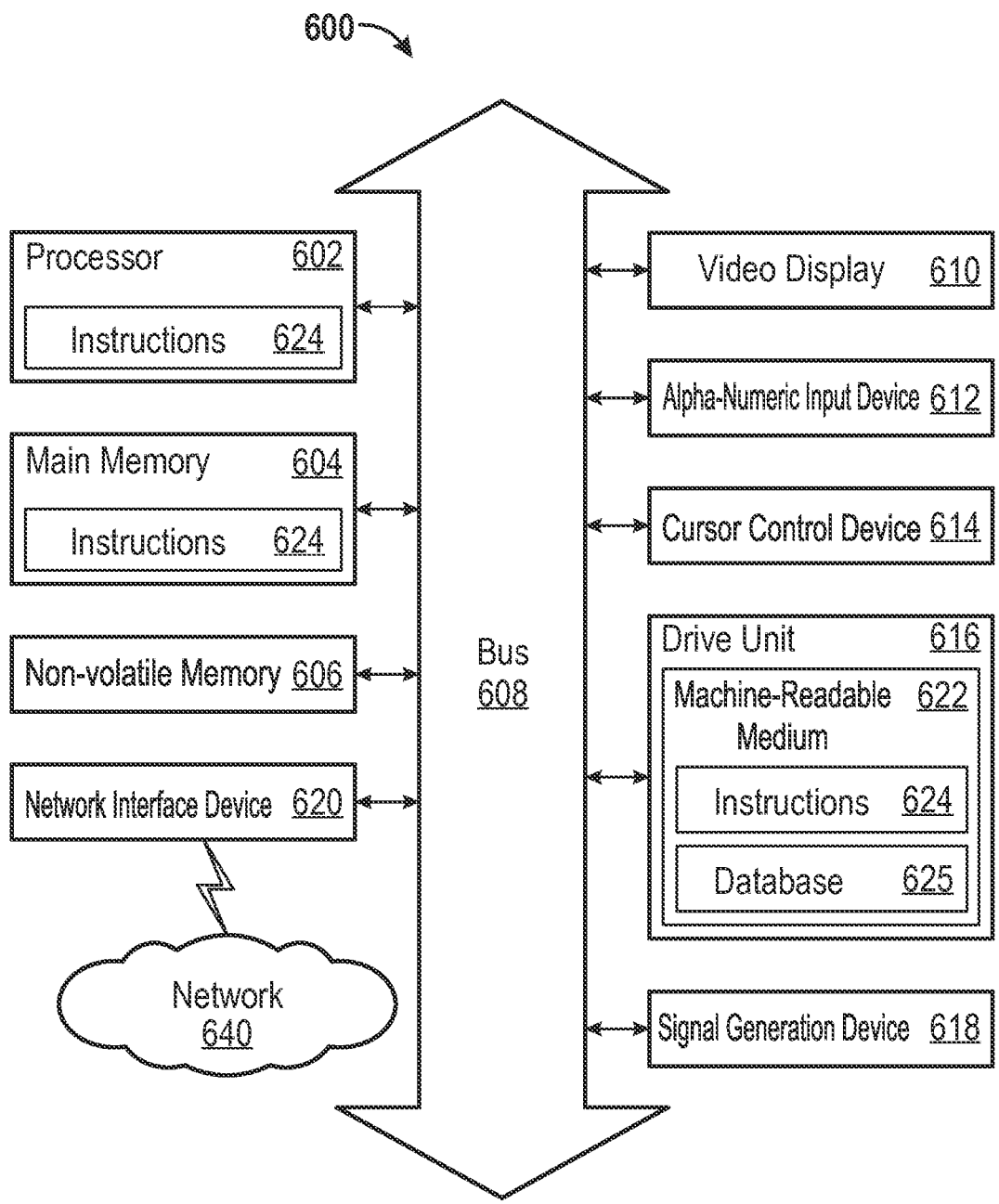
FIG. 6 illustrates an example machine within which a set of instructions for causing the machine to perform one or more of the embodiments described herein can be executed in accordance with an embodiment of the invention.

FIG. 6 is a diagrammatic representation of an embodiment of the machine 600, within which a set of instructions for causing the machine to perform one or more of the embodiments described herein can be executed. The machine may be connected (e.g., networked) to other machines. In a networked deployment, the machine may operate in the capacity of a server or a client machine in a client-server network environment, or as a peer machine in a peer-to-peer (or distributed) network environment.

The machine 600 includes a processor 602 (e.g., a central processing unit (CPU), a graphics processing unit (GPU), or both), a main memory 604, and a nonvolatile memory 606 (e.g., volatile RAM and non-volatile RAM), which communicate with each other via a bus 608. In some embodiments, the machine 600 can be a desktop computer, a laptop computer, personal digital assistant (PDA), or mobile phone, for example. In one embodiment, the machine 600 also includes a video display 610, an alphanumeric input device 612 (e.g., a keyboard), a cursor control device 614 (e.g., a mouse), a drive unit 616, a signal generation device 618 (e.g., a speaker) and a network interface device 620.

In one embodiment, the video display 610 includes a touch sensitive screen for user input. In one embodiment, the touch sensitive screen is used instead of a keyboard and mouse. The disk drive unit 616 includes a machine-readable medium 622 on which is stored one or more sets of instructions 624 (e.g., software) embodying any one or more of the methodologies or functions described herein. The instructions 624 can also reside, completely or at least partially, within the main memory 604 and/or within the processor 602 during execution thereof by the computer system 600. The instructions 624 can further be transmitted or received over a network 640 via the network interface device 620. In some embodiments, the machine-readable medium 622 also includes a database 625.

Volatile RAM may be implemented as dynamic RAM (DRAM), which requires power continually in order to refresh or maintain the data in the memory. Non-volatile memory is typically a magnetic hard drive, a magnetic optical drive, an optical drive (e.g., a DVD RAM), or other type of memory system that maintains data even after power is removed from the system. The non-volatile memory may also be a random access memory. The non-volatile memory can be a local device coupled directly to the rest of the components in the data processing system. A non-volatile memory that is remote from the system, such as a network storage device coupled to any of the computer systems described herein through a network interface such as a modem or Ethernet interface, can also be used.

While the machine-readable medium 622 is shown in an exemplary embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure. The term "machine-readable medium" shall accordingly be taken to include, but not be limited to, solid-state memories, optical and magnetic media, and carrier wave signals. The term "storage module" as used herein may be implemented using a machine-readable medium.

In general, the routines executed to implement the embodiments of the invention can be implemented as part of an operating system or a specific application, component, program, object, module or sequence of instructions referred to as "programs" or "applications". For example, one or more programs or applications can be used to execute specific processes described herein. The programs or applications typically comprise one or more instructions set at various times in various memory and storage devices in the machine and that, when read and executed by one or more processors, cause the machine to perform operations to execute elements involving the various aspects of the embodiments described herein.

The executable routines and data may be stored in various places, including, for example, ROM, volatile RAM, non-volatile memory, and/or cache. Portions of these routines and/or data may be stored in any one of these storage devices. Further, the routines and data can be obtained from centralized servers or peer-to-peer networks. Different portions of the routines and data can be obtained from different centralized servers and/or peer-to-peer networks at different times and in different communication sessions, or in a same communication session. The routines and data can be obtained in entirety prior to the execution of the applications. Alternatively, portions of the routines and data can be obtained dynamically, just in time, when needed for execution. Thus, it is not required that the routines and data be on a machine-readable medium in entirety at a particular instance of time.

While embodiments have been described fully in the context of machines, those skilled in the art will appreciate that the various embodiments are capable of being distributed as a program product in a variety of forms, and that the embodiments described herein apply equally regardless of the particular type of machine- or computer-readable media used to actually effect the distribution. Examples of machine-readable media include, but are not limited to, recordable type media such as volatile and non-volatile memory devices, floppy and other removable disks, hard disk drives, optical disks (e.g., Compact Disk Read-Only Memory (CD ROMS), Digital Versatile Disks, (DVDs), etc.), among others, and transmission type media such as digital and analog communication links.

Alternatively, or in combination, the embodiments described herein can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

For purposes of explanation, numerous specific details are set forth in order to provide a thorough understanding of the description. It will be apparent, however, to one skilled in the art that embodiments of the disclosure can be practiced without these specific details. In some instances, modules, structures, processes, features, and devices are shown in block diagram form in order to avoid obscuring the description. In other instances, functional block diagrams and flow diagrams are shown to represent data and logic flows. The components of block diagrams and flow diagrams (e.g., modules, engines, blocks, structures, devices, features, etc.) may be variously combined, separated, removed, reordered, and replaced in a manner other than as expressly described and depicted herein.

Reference in this specification to "one embodiment", "an embodiment", "other embodiments", "another embodiment", or the like means that a particular feature, design, structure, or characteristic described in connection with the embodiment is included in at least one embodiment of the disclosure. The appearances of, for example, the phrases "according to an embodiment", "in one embodiment", "in an embodiment", or "in another embodiment" in various places in the specification are not necessarily all referring to the same embodiment, nor are separate or alternative embodiments mutually exclusive of other embodiments. Moreover, whether or not there is express reference to an "embodiment" or the like, various features are described, which may be variously combined and included in some embodiments but also variously omitted in other embodiments. Similarly, various features are described which may be preferences or requirements for some embodiments but not other embodiments.

Although embodiments have been described with reference to specific exemplary embodiments, it will be evident that the various modifications and changes can be made to these embodiments. Accordingly, the specification and drawings are to be regarded in an illustrative sense rather than in a restrictive sense. The foregoing specification provides a description with reference to specific exemplary embodiments. It will be evident that various modifications can be made thereto without departing from the broader spirit and scope as set forth in the following claims. The specification and drawings are, accordingly, to be regarded in an illustrative sense rather than a restrictive sense.

Although some of the drawings illustrate a number of operations or method steps in a particular order, steps that are not order dependent may be reordered and other steps may be combined or omitted. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

It should also be understood that a variety of changes may be made without departing from the essence of the invention. Such changes are also implicitly included in the description. They still fall within the scope of this invention. It should be understood that this disclosure is intended to yield a patent covering numerous aspects of the invention, both independently and as an overall system, and in both method and apparatus modes.

Further, each of the various elements of the invention and claims may also be achieved in a variety of manners. This disclosure should be understood to encompass each such variation, be it a variation of an embodiment of any apparatus embodiment, a method or process embodiment, or even merely a variation of any element of these.

What is claimed is:

1. A computer implemented method comprising:
automatically importing, by a computer system, different types or forms of data from a plurality of different data sources, wherein at least a portion of the imported data is associated with at least one of a sensor and a meter belonging to said plurality of different data sources;
converting, by the computer system, the imported data based on a data model, wherein the data model comprises a set of canonical object definitions, wherein the canonical object definitions include standardized interface definitions based on industry standards;

normalizing, by the computer system, the converted data by filling in gaps in the converted data and addressing outliers in the converted data;

persisting, by the computer system, the normalized data in a plurality of different data stores comprising a relational database and a key-value store; and performing, by the computer system, analytics on the persisted data, wherein the performing of said analytics comprises:

(i) a prediction step comprising feature extraction, classification, and ranking, wherein said feature extraction comprises providing the persisted data to a feature extraction machine learning model comprising one or more learning detection parameters, wherein the feature extraction machine learning model is configured to (a) extract a plurality of features associated with signatures of malfunction and/or theft from the persisted data and (b) identify one or more data sources that exhibit the signatures of malfunction and/or theft, wherein said classification comprises providing the one or more data sources identified as having the signatures of malfunction or theft to a classification model configured to selectively merge two or more related features of the plurality of features or apply different weights to the plurality of features based on signature types in order to classify each of the one or more data sources as having a signature of malfunction or a signature of theft, and wherein said ranking comprises generating a priority order for resolving the malfunction and/or theft of the one or more data sources based on an impact of the malfunction and/or theft on business operations of an entity, and (ii) using empirical data as supervised feedback to adjust the one or more learning detection parameters and train the feature extraction machine learning model, wherein the empirical data comprises data generated from investigation of the plurality of different data sources by field personnel.

2. The computer implemented method of claim 1 wherein the at least one of a sensor and a meter is in remote communication with the computer system.

3. The computer implemented method of claim 1, wherein said portion of said imported data comprises time-series resource consumption data from said meter.

4. The computer implemented method of claim 3, wherein said computer system is integrated into a resource management platform configured to be used by an enterprise for monitoring resource usage.

5. The computer implemented method of claim 4, wherein the at least one of a sensor and a meter is associated with one of a plurality of facilities of the enterprise, wherein said plurality of facilities are distributed over a plurality of geographic locations.

6. The computer implemented method of claim 1, wherein the portion of the imported data that is associated with the at least one of a sensor and a meter relates to resource data.

7. The computer implemented method of claim 1, wherein the performing of said analytics on the persisted data further comprises:

stream processing resource usage readings from said meter or said sensor.

8. The computer implemented method of claim 1, further comprising:

batch processing the persisted data to generate reports on resource usage on a temporal basis.

9. A system comprising:

a server; and a memory storing instructions configured to instruct the server to perform operations comprising:

automatically importing different types or forms of data from a plurality of different data sources, wherein at least a portion of the imported data is associated with at least one of a sensor and a meter belonging to said plurality of different data sources;

converting the imported data based on a data model, wherein the data model comprises a set of canonical object definitions, wherein the canonical object definitions include standardized interface definitions based on industry standards;

normalizing the converted data by filling in gaps in the converted data and addressing outliers in the converted data;

persisting the normalized data in a plurality of different data stores comprising a relational database and a key-value store; and performing analytics on the persisted data, wherein the performing of said analytics comprises:

(i) a prediction step comprising feature extraction, classification, and ranking, wherein said feature extraction comprises providing the persisted data to a feature extraction machine learning model comprising one or more learning detection parameters, wherein the feature extraction machine learning model is configured to (a) extract a plurality of features associated with signatures of malfunction and/or theft from the persisted data and (b) identify one or more data sources that exhibit the signatures of malfunction and/or theft, wherein said classification comprises providing the one or more data sources identified as having the signatures of malfunction or theft to a classification model configured to selectively merge two or more related features of the plurality of features or apply different weights to the plurality of features based on signature types in order to classify each of the one or more data sources as having a signature of malfunction or a signature of theft, and wherein said ranking comprises generating a priority order for resolving the malfunction and/or theft of the one or more data sources based on an impact of the malfunction and/or theft on business operations of an entity, and (ii) using empirical data as supervised feedback to adjust the one or more learning detection parameters and train the feature extraction machine learning model, wherein the empirical data comprises data generated from investigation of the plurality of different data sources by field personnel.

10. The system of claim 9 wherein the at least one of a sensor and a meter is in remote communication with the server.

11. The system of claim 9, wherein the at least one of a sensor and a meter is associated with one of a plurality of facilities of an enterprise, wherein said plurality of facilities are distributed over a plurality of geographic locations.

12. A non-transitory computer-readable storage medium including instructions that, when executed by at least one processor of a computing system, cause the computing system to perform operations comprising:

automatically importing different types or forms of data from a plurality of different data sources, wherein at least a portion of the imported data is associated with at least one of a sensor and a meter belonging to said plurality of different data sources;

converting the imported data based on a data model, wherein the data model comprises a set of canonical object definitions, wherein the canonical object definitions include standardized interface definitions based on industry standards;

normalizing the converted data by filling in gaps in the converted data and addressing outliers in the converted data;

persisting the normalized data in a plurality of different data stores comprising a relational database and a key-value store; and performing analytics on the persisted data, wherein the performing of said analytics comprises:
(i) a prediction step comprising feature extraction, classification, and ranking, wherein said feature extraction comprises providing the persisted data to a feature extraction machine learning model comprising one or more learning detection parameters, wherein the feature extraction machine learning model is configured to (a) extract a plurality of features associated with signatures of malfunction and/or theft from the persisted data and (b) identify one or more data sources that exhibit the signatures of malfunction and/or theft, wherein said classification comprises providing the one or more data sources identified as having the signatures of malfunction or theft to a classification model configured to selectively merge two or more related features of the plurality of features or apply different weights to the plurality of features based on signature types in order to classify each of the one or more data sources as having a signature of malfunction or a signature of theft, and wherein said ranking comprises generating a priority order for resolving the malfunction and/or theft of the one or more data sources based on an impact of the malfunction and/or theft on business operations of an entity, and
(ii) using empirical data as supervised feedback to adjust the one or more learning detection parameters and train the feature extraction machine learning model, wherein the empirical data comprises data generated from investigation of the plurality of different data sources by field personnel.

13. The non-transitory computer-readable storage medium of claim 12 wherein the at least one of a sensor and a meter is in remote communication with the computing system.

14. The non-transitory computer-readable storage medium of claim 12, wherein the at least one of a sensor and a meter is associated with one of a plurality of facilities of an enterprise, wherein said plurality of facilities are distributed over a plurality of geographic locations.

15. The computer-implemented method of claim 1, wherein persisting the normalized data comprises (1) storing time-series meter data from said meter in said key-value store; and (2) storing structured data in said relational database.

16. The computer-implemented method of claim 1, wherein a validation step is performed on the imported data prior to converting the imported data based on a data model, wherein the validation step comprises examining a structure of the imported data to ensure that (a) required fields are present and (b) that the imported data matches at least one data type from the data model.

17. The computer-implemented method of claim 16, wherein (i) data that is successfully validated by the validation step is converted based on the data model, and (ii) data that is not successfully validated by the validation step is discarded without converting based on the data model.

18. The computer-implemented method of claim 1, wherein said computing system comprises a cluster of computing nodes, and wherein the method further comprises:
dynamically adding new nodes to the cluster to store and process new data as the new data is being imported from one or more of the different data sources; and
automatically rebalancing and partitioning the data across all of the nodes including the new nodes.

* * * * *